(12) United States Patent
Xiang et al.

(10) Patent No.: US 6,855,982 B1
(45) Date of Patent: Feb. 15, 2005

(54) SELF ALIGNED DOUBLE GATE TRANSISTOR HAVING A STRAINED CHANNEL REGION AND PROCESS THEREFOR

(75) Inventors: Qi Xiang, San Jose, CA (US); James N. Pan, Fishkill, NY (US); Ming Ren Lin, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/770,163

(22) Filed: Feb. 2, 2004

(51) Int. Cl.$^7$ .............................................. H11L 29/76
(52) U.S. Cl. .......................... 257/330; 257/59; 438/259; 438/270; 438/271; 438/589
(58) Field of Search ................... 257/59, 330; 438/259, 438/270, 271, 589

(56) References Cited

PUBLICATIONS

Huang et al., Sub 50 nm Fin FET: PMOS, 1999 (4 pages).

*Primary Examiner*—Fetsum Abraham
(74) *Attorney, Agent, or Firm*—Foley & Lardner LLP

(57) ABSTRACT

A method of manufacturing an integrated circuit with a strained semiconductor channel region. The method can provide a double gate structure. The gate structure can be provided in and above a trench. The trench can be formed in a compound semiconductor material such as a silicon-germanium material. The strained semiconductor can increase the charge mobility associated with the transistor. A silicon-on-insulator substrate can be used.

20 Claims, 8 Drawing Sheets

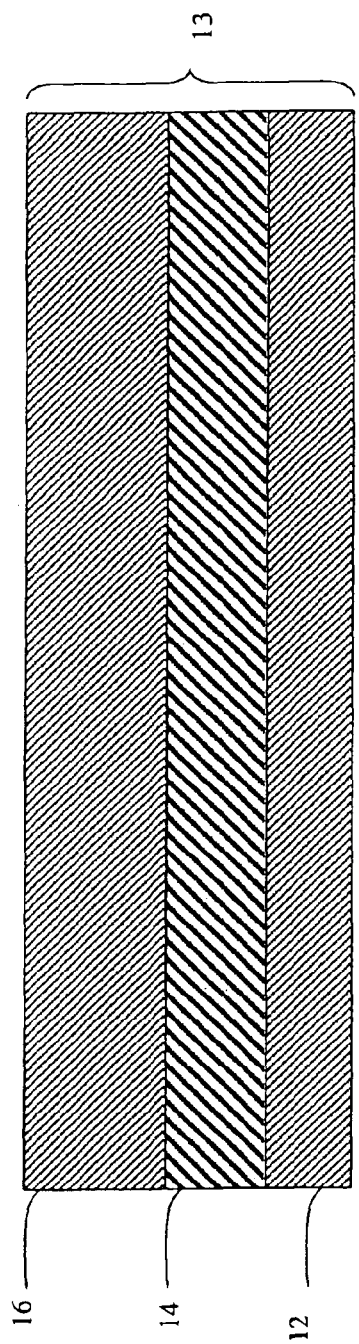
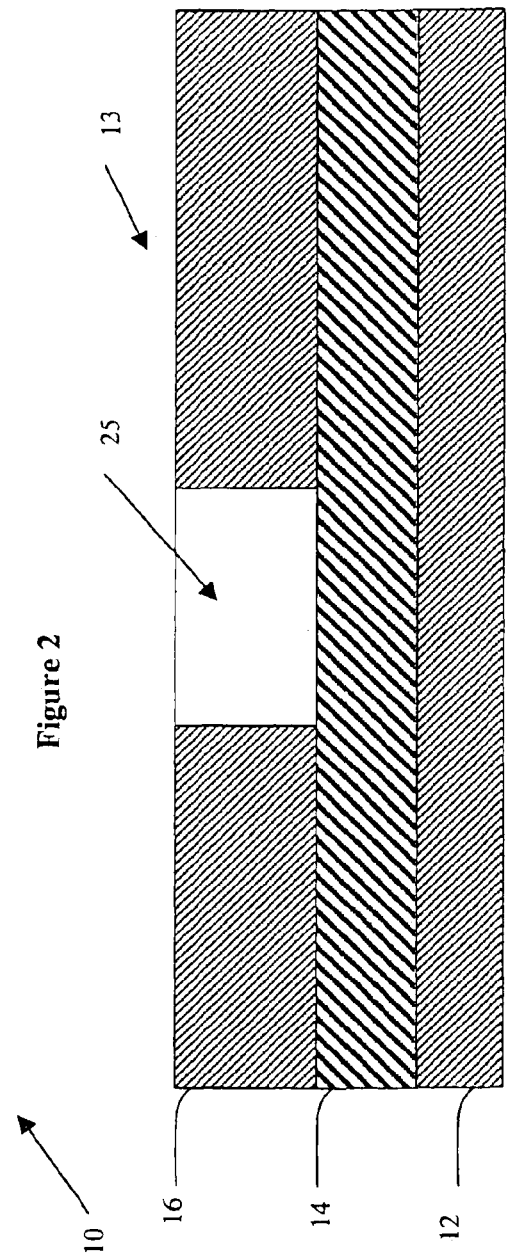

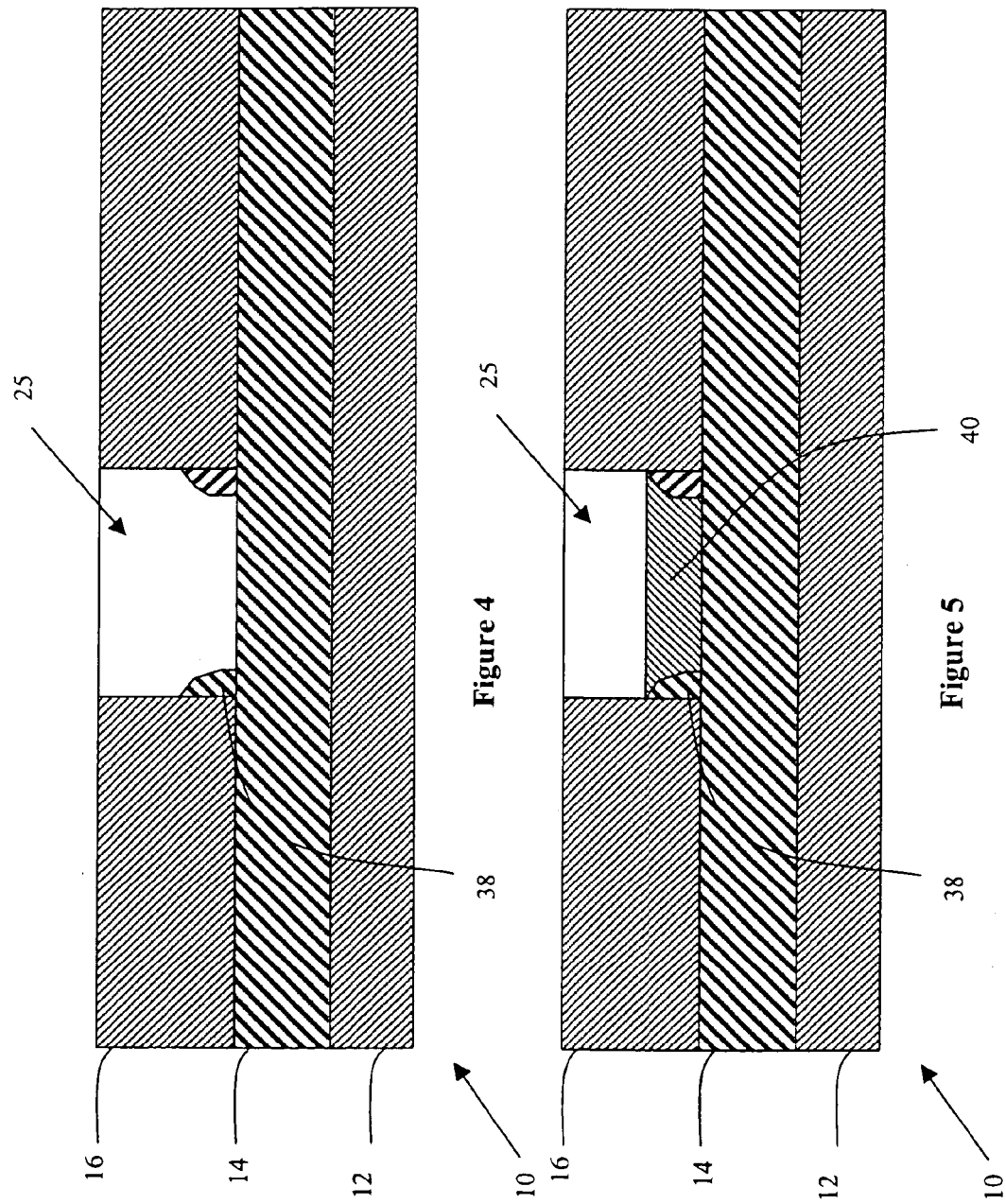

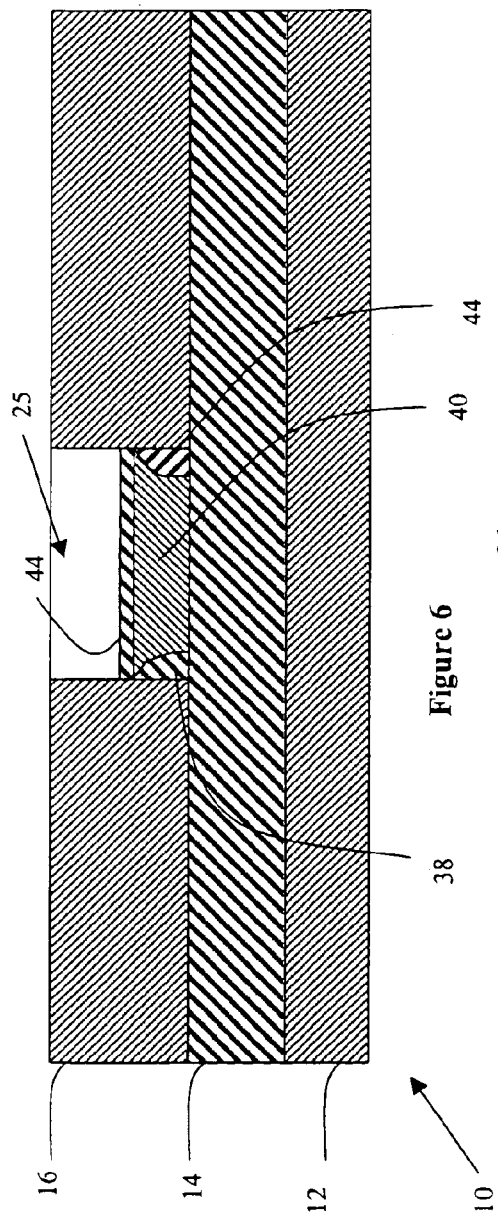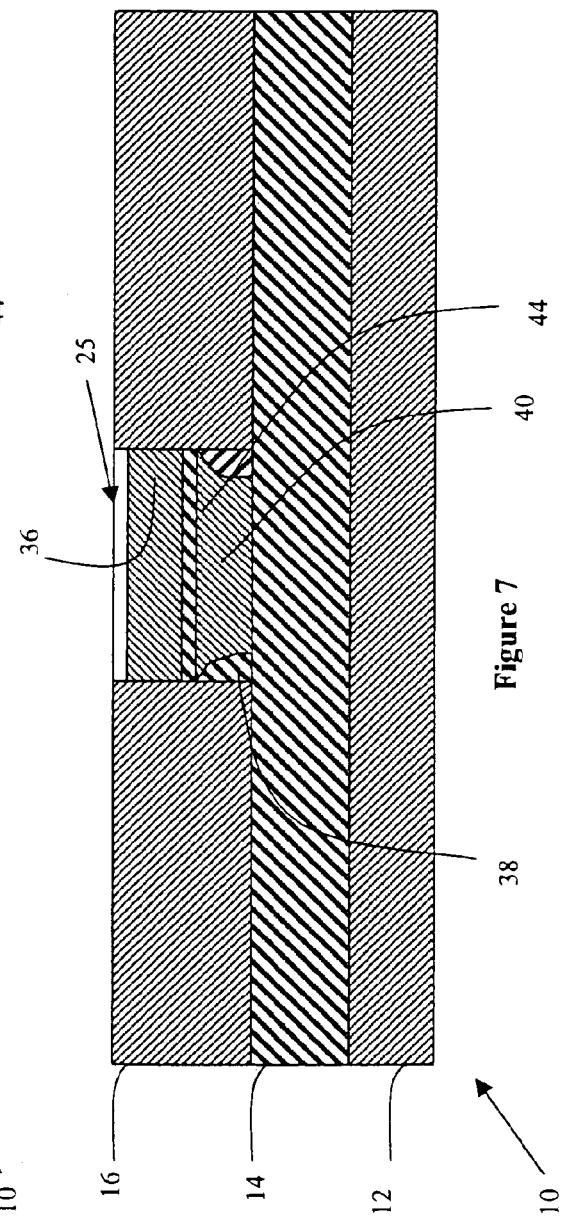

SELF ALIGNED DOUBLE GATE TRANSISTOR HAVING A STRAINED CHANNEL REGION AND PROCESS THEREFOR

FIELD OF THE INVENTION

The present invention relates generally to integrated circuits (ICs) and methods of manufacturing integrated circuits. More particularly, the present invention relates to a transistor with a strained channel region and a double gate structure or a strained metal oxide semiconductor (SMOS) double gate process.

BACKGROUND OF THE INVENTION

As transistors become smaller, it is desirable to increase the charge carrier mobility in the channel region. Increasing charge carrier mobility increases the switching speed of the transistor. Channel regions formed from materials other than silicon have been proposed to increase charge carrier mobility. For example, conventional thin film transistors which typically utilize polysilicon channel regions have been formed on a silicon-germanium (Si—Ge) epitaxial layer above a glass ($SiO_2$) substrate. The Si—Ge epitaxial layer can be formed by a technique in which a semiconductor thin film such as an amorphous silicon hydride (a-Si:H), an amorphous germanium hydride (a-Ge:H), or the like is melted and crystallized by the irradiation of pulse laser beams.

In a bulk type device such as a metal oxide semiconductor field effect transistor (MOSFET), the use of Si—Ge materials could be used to increase charge carrier mobility, especially hole-type carriers. A tensile-strained silicon channel region can have carrier mobility 2–5 times greater than a conventional Si channel region due to reduced carrier scattering and the reduced mass of holes in the germanium-containing material. According to conventional Si—Ge formation techniques for bulk-type devices, a dopant implant molecular beam epitaxy (MBE) technique forms a Si—Ge epitaxial layer. However, the MBE technique requires very complicated, very expensive equipment, and is not as desirable as other processes for mass production of ICs.

Double gate transistors, such as double gate silicon-on-insulator (SOI) transistors, have significant advantages related to high drive current and also exhibit high immunity to short channel effects. An article by Huang et al. entitled "Sub-50 nm FinFET: PMOS", (1999 IEDM) discusses a silicon transistor in which the active layer is surrounded by a gate on two sides. However, double gate structures can be difficult to manufacture using conventional IC fabrication tools and techniques.

Heretofore, double gate transistors have been difficult to align. Misalignments between double gates can adversely affect the operation of the transistor. Further, it is desirable to form a strained channel double gate silicon-on-insulator transistor using process steps suitable for mass production of ICs. Yet further still, there is a need for a method of manufacturing a self-aligned double gate semiconductor-on-insulator transistor.

Thus, there is a need for an integrated circuit or electronic device that includes channel regions with higher channel mobility, higher immunity to short channel effects, and higher drive current. Further, there is a need for transistors with a strained channel region that can be more easily manufactured. Even further, there is a need for a method of manufacturing a double gate, fully depleted, semiconductor-on-insulator transistor. Yet further, there is a need for a method of fabricating a double gate transistor having a strained silicon channel. Yet even further, there is a need for an efficient method of manufacturing a double gate transistor having a strained channel.

SUMMARY OF THE INVENTION

An exemplary embodiment relates to a method of manufacturing an integrated circuit on a substrate. The substrate includes a compound semiconductor layer. The method includes providing a trench in the compound semiconductor layer, providing a bottom gate in the trench, and forming a strained semiconductor above the bottom gate and in the trench.

Another exemplary embodiment relates to a transistor. The transistor includes a first gate conductor disposed in a trench of a compound semiconductor layer, a strained semiconductor layer disposed in the trench, and a second gate conductor disposed above the strained semiconductor layer. The strained semiconductor layer is also disposed above the first gate conductor and the second gate is also disposed above the trench.

Still another exemplary embodiment relates to a process of forming a transistor having a strained silicon channel region. The process includes forming a trench in a compound semiconductor material, and forming a first gate at a bottom portion of the trench. The method also includes growing strained silicon above the first gate for the strained silicon channel region and forming a second gate above the strained silicon.

BRIEF DESCRIPTION OF THE DRAWINGS

Exemplary embodiments will hereafter be described with reference to the accompanying drawings, wherein like numerals denote like elements, and:

FIG. 2 is a cross-sectional view of the portion of the integrated circuit illustrated in FIG. 1, showing a substrate having a compound semiconductor layer;

FIG. 3 is a cross-sectional view of the portion of the integrated circuit illustrated in FIG. 2, showing a trench etching step;

FIG. 4 is a cross-sectional view of the portion of the integrated circuit illustrated in FIG. 3, showing a spacer formation step;

FIG. 5 is cross-sectional view of the portion of the integrated circuit illustrated in FIG. 4, showing a first gate conductor deposition step;

FIG. 6 is a cross-sectional view of the portion of the integrated circuit illustrated in FIG. 5, showing a first gate dielectric formation step;

FIG. 7 is a cross-sectional view of the portion of the integrated circuit illustrated in FIG. 6, showing a strained semiconductor material formation step;

DETAILED DESCRIPTION OF THE PREFERRED EMBODIMENTS

Figure 1:
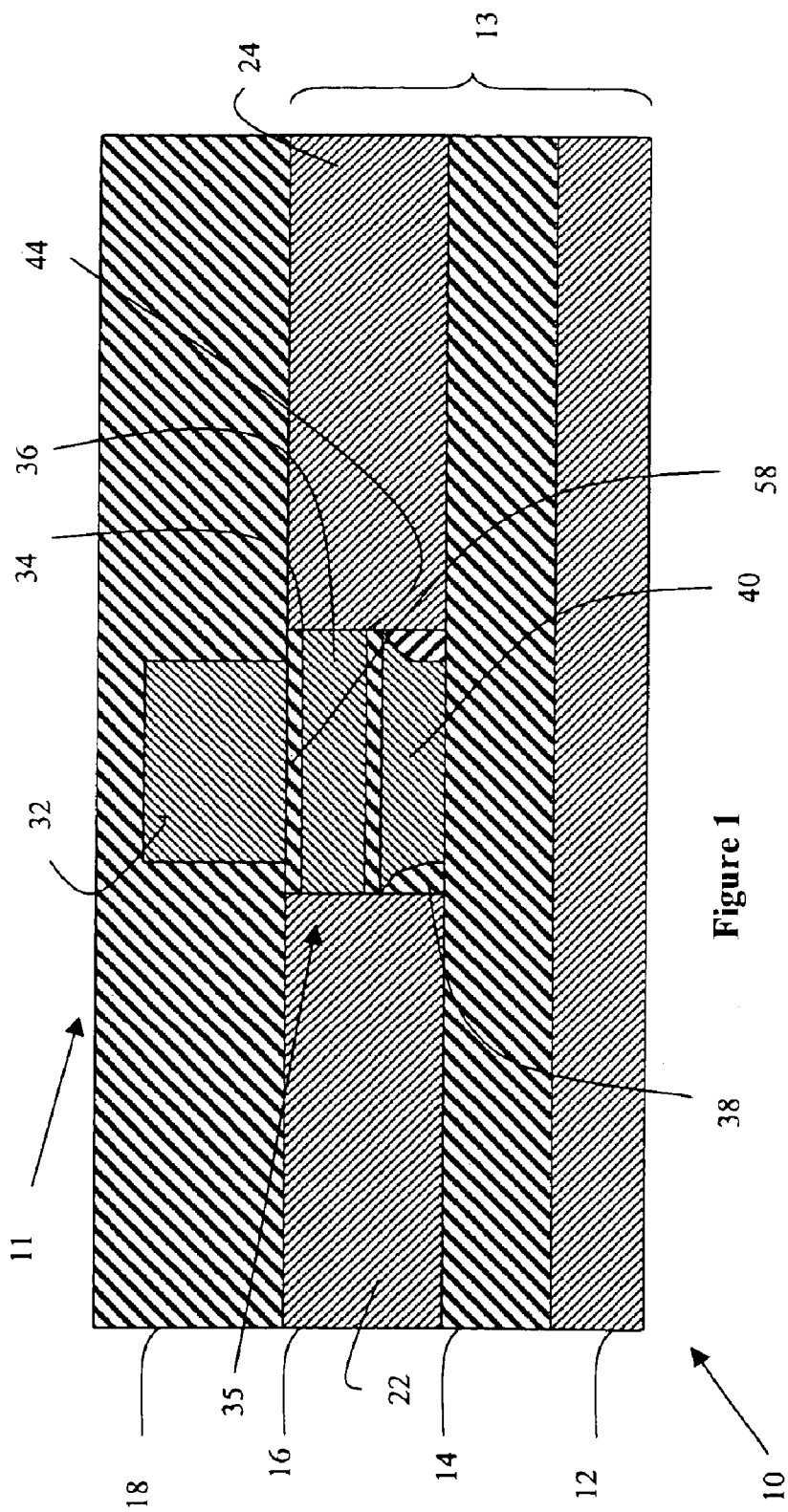
FIG. 1 is a schematic cross-sectional view of a portion of an integrated circuit in accordance with an exemplary embodiment, the portion including a transistor having a strained semiconductor channel region and a self-aligned double gate structure.
Figure 9:
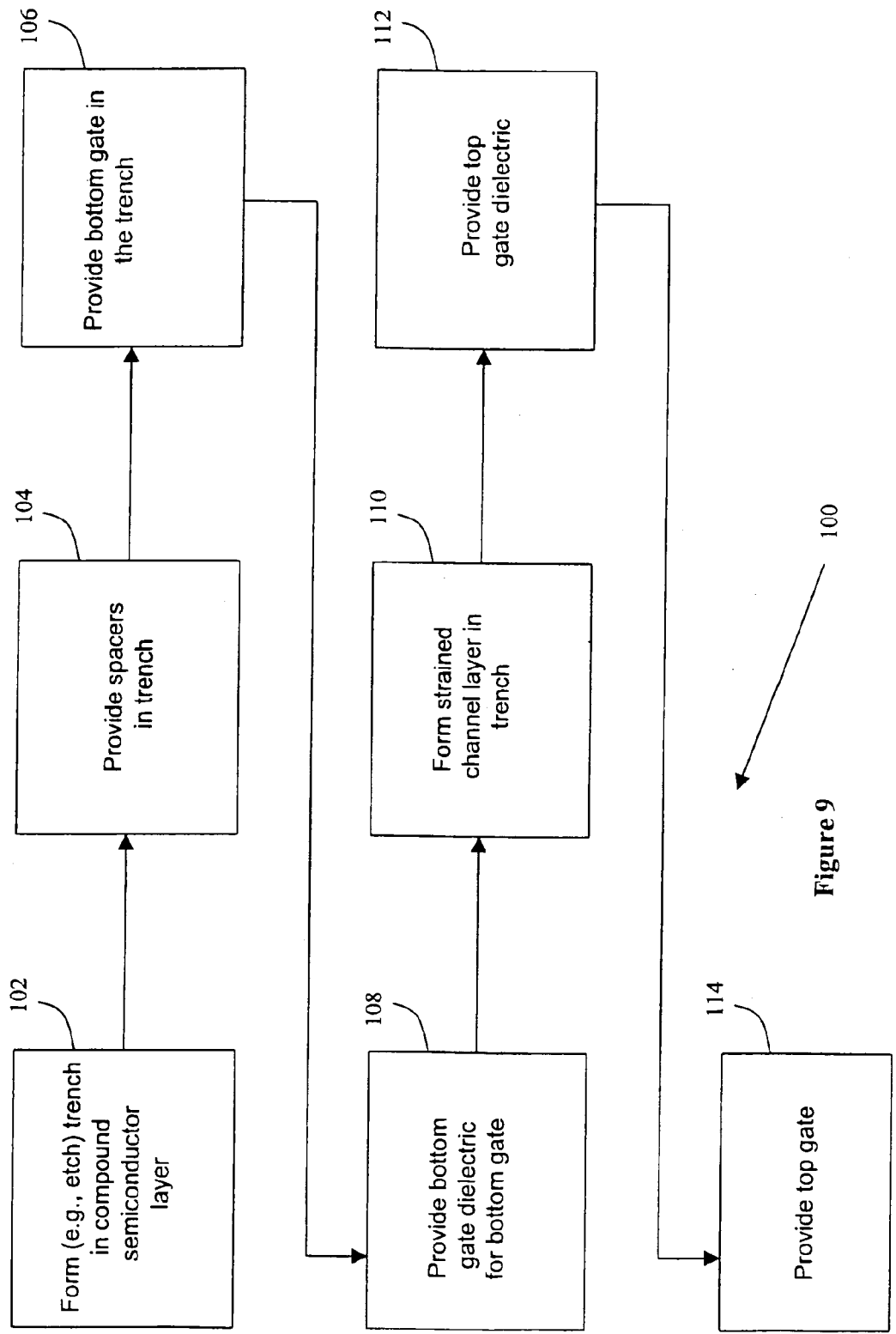
FIG. 9 is a general block diagram of the process utilized to form the structure illustrated in FIG. 1.

With reference to FIGS. 1 and 9, a process 100 can be used to fabricate a portion 10 of an integrated circuit (IC). Portion 10 includes a transistor 11 which is disposed on a semiconductor substrate 13, such as a wafer. Semiconductor substrate 13 is preferably a semiconductor-on-insulator (SOI) substrate (preferably silicon-germanium-on-glass). Alternatively, substrate 13 can be an insulative substrate or bulk substrate including a compound semiconductor layer including a material such as silicon-germanium.

Transistor 11 can be a P-channel or N-channel metal oxide semiconductor field effect transistor (MOSFET). Transistor 11 is preferably embodied as a fully depleted (FD), self-aligned, double gate, SOI MOSFET and includes a gate conductor 32, a gate conductor 40, a source region 22, and a drain region 24. The double gate structure associated with conductors 32 and 40 advantageously provides increased drive current and relatively high immunity to short channel effects. An insulative layer 18 is provided over source region 22, drain region 24, and gate conductor 40.

Substrate 13 preferably includes a compound semiconductor layer 16, a buried insulative layer 14 (e.g., a buried oxide or BOX layer), and a base layer 12. Layer 16 can be a 1000–2000 Å thick layer of compound semiconductor material, such as a silicon-germanium layer. Layer 16 is preferably a silicon-germanium or other semiconductor material including germanium that is capable of inducing stress. Layer 16 can be doped with P-type or N-type dopants. Layer 16 is preferably a composition of silicon and germanium having the formula $Si_{(1-x)}Ge_x$, where x is approximately 0.2 and more generally in the range of 0.1–0.3. Layer 16 can be grown or deposited.

In one embodiment, layer 16 is grown above layer 14 by chemical vapor deposition (CVD) using disilane ($Si_2H_6$) and germane ($GeH_4$) as source gases with the substrate temperature of 650° C., a disilane partial pressure of 30 mPa, and a germane partial pressure of 60 mPa. The growth of silicon-germanium material may be initiated using these ratios, or alternatively, the partial pressure of germanium may be gradually increased beginning from a lower pressure (e.g., zero pressure) to form a gradient composition. Alternatively, a silicon layer can be doped by ion implantation with germanium or other processes can be utilized to form layer 16.

Layer 16 can be grown by epitaxy or deposited. Buried insulative layer 14 is provided on base layer 12. Layer 14 can be formed above base layer 12 in a variety of conventional processes. Layer 14 can be a layer of silicon dioxide having a thickness of between approximately 200 and 1000 Å. Base layer 12 can be a single crystalline silicon material. Alternatively, substrate 13 with layers 12, 14 and 16 can be purchased from a wafer supplier.

Transistor 11 includes a trench structure 35 with a gate conductor 32 at a top of trench structure 35 and a gate conductor 40 at a bottom portion of trench structure 35. Trench structure 35 allows transistor 11 to have a self-aligned channel.

Gate conductor 40 is preferably disposed between insulative spacers 38 within trench structure 35. Insulative spacers 38 provide isolation between gate conductor 40 and source and drain regions 22 and 24. Gate conductor 40 is isolated from a channel region 36 by a gate dielectric or insulative layer 44.

Channel region 36 is advantageously an SMOS or strained semiconductor material. Region 36 is preferably between approximately 80 and 200 Å thick (preferably half of the gate length for short channel effect control). Region 36 preferably has the same width from left to right as trench structure 35 (e.g., preferably between 150 and 300 nm), depending upon desired gate length. Similarly, gate conductor 40 has the same width as trench structure 35 less the width associated with spacers 38. Spacers 38 are preferably made of insulative materials such as silicon dioxide or silicon nitride and have a height greater than or approximately the same as the thickness of conductor 40.

In one embodiment, gate conductor 40 is preferably between approximately 500 and 1700 Å thick. Spacers 38 preferably have a width of between approximately 50 nm and 150 nm. Insulative layer 44 is preferably silicon dioxide or other dielectric and has a thickness between approximately 15 and 30 Å.

A gate dielectric or insulative layer 58 associated with gate conductor 32 is provided above channel region 36. Preferably, insulative layer 58 is a silicon dioxide or silicon nitride material having a thickness of between approximately 15 Å and 30 Å and a width approximately the same as the width of trench structure 35. Gate dielectric 58 provides insulation between gate conductor 32 and channel region 36 and can be a silicon dioxide or a high K dielectric material.

Gate conductor 32 can also include a pair of sidewall spacers. The sidewall spacers can be manufactured in accordance with a conventional deposition and etch-back process. The spacers can be utilized in doping source and drain regions 22 and 24 to form source and drain extensions.

Regions 22 and 24 are preferably heavily doped with N-type or P-type dopants (e.g., $5 \times 10^{19}$–$5 \times 10^{21}$ dopants per cubic centimeter). Appropriate dopants for a P-channel transistor include boron, boron difluoride, and iridium, and appropriate dopants for an N-channel transistor include arsenic, phosphorous, and antimony.

Gate conductor 32 is preferably between approximately 500 and 1500 Å thick. Layers 58 and 44 can preferably have similar thicknesses and be manufactured from the same material. In other embodiments, layers 58 and 46 can have different thickness and be different materials to achieve different work functions. In one embodiment, gate conductors 40 and 32 are manufactured from polysilicon.

Source and drain regions 22 and 24 can be silicided. Conventional metal silicidation techniques can be utilized. Regions 22 and 24 as well as conductors 40 and 32 can be coupled to metal layers via contacts.

With reference to FIGS. 1–9, the fabrication of transistor 11, including channel region 36 in trench structure 35 is described as follows. The advantageous process 100 allows channel region 36 to be a strained semiconductor material and yet does not require MBE equipment. Process 100 also allows a self-aligned, dual gate transistor 11 to be efficiently formed.

In FIG. 2, SOI substrate 13 includes compound semiconductor layer 16, buried insulative layer 14 and base layer 12.

In FIG. 3, layer 16 is etched to form a trench 25 associated with trench structure 35 (FIG. 1) in accordance with a step 102 of process 100. Preferably, layer 16 is etched in accordance with a photolithographic patterning process. Layer 16 is etched so that trench 25 has a bottom which reaches layer 14. In one embodiment, the etching process is a dry etching process selective to layer 16 with respect to layer 14. Trench 25 is preferably between approximately 1500 and 2000 Å wide from left to right in FIG. 3 and between approximately 1000 and 2000 Å deep. Etching is preferably dry etching using HBr, $HF_4$, $SF_6$, or other etchant.

In FIG. 4, spacers 38 are provided on sidewalls of trench 25 in a step 104 of process 100. Preferably, spacers 38 are made of an insulative material such as silicon dioxide. Spacers 38 can be formed by deposition and etched back within trench 25. The layer for spacers 38 is overetched so that spacers 38 are recessed by 200–300 Å. Alternatively, in FIG. 2, a hard mask layer such as a silicon nitride layer can be provided above layer 16. Aperture 25 is provided through the silicon nitride layer.

In FIG. 5, after spacers 38 are formed, a bottom gate or gate conductor 40 is provided in a step 106 of process 100. Preferably, gate conductor 40 is a polysilicon material deposited by chemical vapor deposition (CVD) above layer 14 and within trench 25. Gate conductor 40 preferably has a height of less than or approximately the same as the height of spacers 38. Gate conductor 40 can be doped with P-type or N-type dopants to increase conductivity. With reference to FIG. 5, gate conductor 40 is etched and layer 16 is protected by the hard mask layer. Preferably, the gate conductor layer is etched to recess layer 40 approximately 250–400 Å thereby resulting in conductor 40 having a smaller height than spacers 38.

In FIG. 6, insulative layer 44 is provided within trench 25 as a bottom dielectric layer for a bottom gate in accordance with step 108 of process 100. Layer 44 is preferably thermally grown or deposited above gate conductor 40. Thermal growth preferably consumes a top portion of gate conductor 40 to ensure isolation of gate conductor 40 from source and drain regions 22 and 24 (FIG. 1). Layer 44 is preferably a layer of silicon dioxide having a thickness between approximately 15 Å and 30 Å. Alternatively, other dielectric materials can be utilized for layer 44.

In FIG. 7, channel region 36 is formed in trench 25 in accordance with a step 110 of process 100. Region 40 is preferably formed to a thickness of between approximately 500 and 1500 Å and has approximately the same width as trench 25. Region 36 is preferably formed by lateral growth using compound semiconductor layer 16 as a seed layer. Region 36 preferably is under tensile stress due to the lattice mismatch associated with layer 16 (e.g., the lattice strain in layer 16 acts to provide a lattice strain in region 36 as region 36 is grown laterally from layer 16).

In one embodiment, region 36 is grown by first sputter depositing a silicon nitride layer. The silicon nitride layer is not deposited on the side walls of trench 35 due to the non-conformal sputter process. Any oxide is removed from the side of trench 35 by HF etching. Next, the silicon nitride is removed in a hot phosphoric acid etch. Selective epitaxy of silicon is used to grow region 36 via the crystal sidewall surface of trench structure 35.

Figure 8:
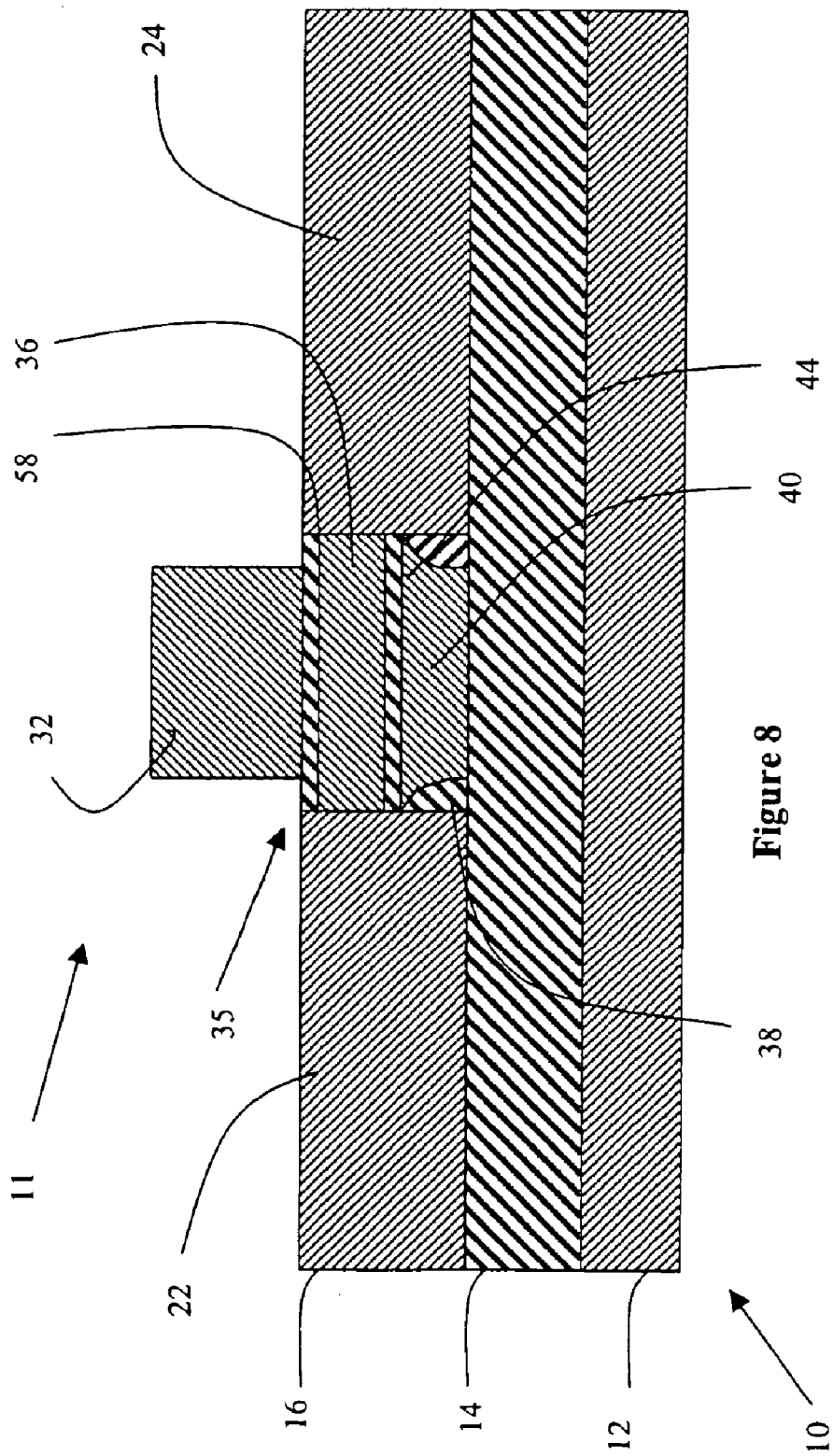
FIG. 8 is a cross-sectional view of the portion of the integrated circuit illustrated in FIG. 6, showing a second gate dielectric deposition step and a second gate conductor formation step.

In FIG. 8, a top dielectric layer or dielectric layer 58 is provided above region 36 in accordance with step 112 of process 100. Layer 58 can be a layer having a thickness of 200 Å and can be provided by thermal growth or high temperature deposition.

A top gate or gate conductor 32 is provided above layer 58 in accordance with a step 114 of process 100. Gate conductor 32 can be a polysilicon or metal material. Gate conductor 32 is preferably provided by chemical vapor deposition and etched to form gate conductor 32.

In one embodiment, gate conductor 32 is a polysilicon material doped for increased conductivity. Gate conductor 32 is preferably slightly smaller than the width of trench structure 35. Gate conductor 32 can have a height of 1,000–2,000 Å. Insulative layer 58 can be provided above source and drain regions 22 and 24 (FIG. 1) and gate conductor 32 for isolation according to an alternative embodiment.

Figure 10:
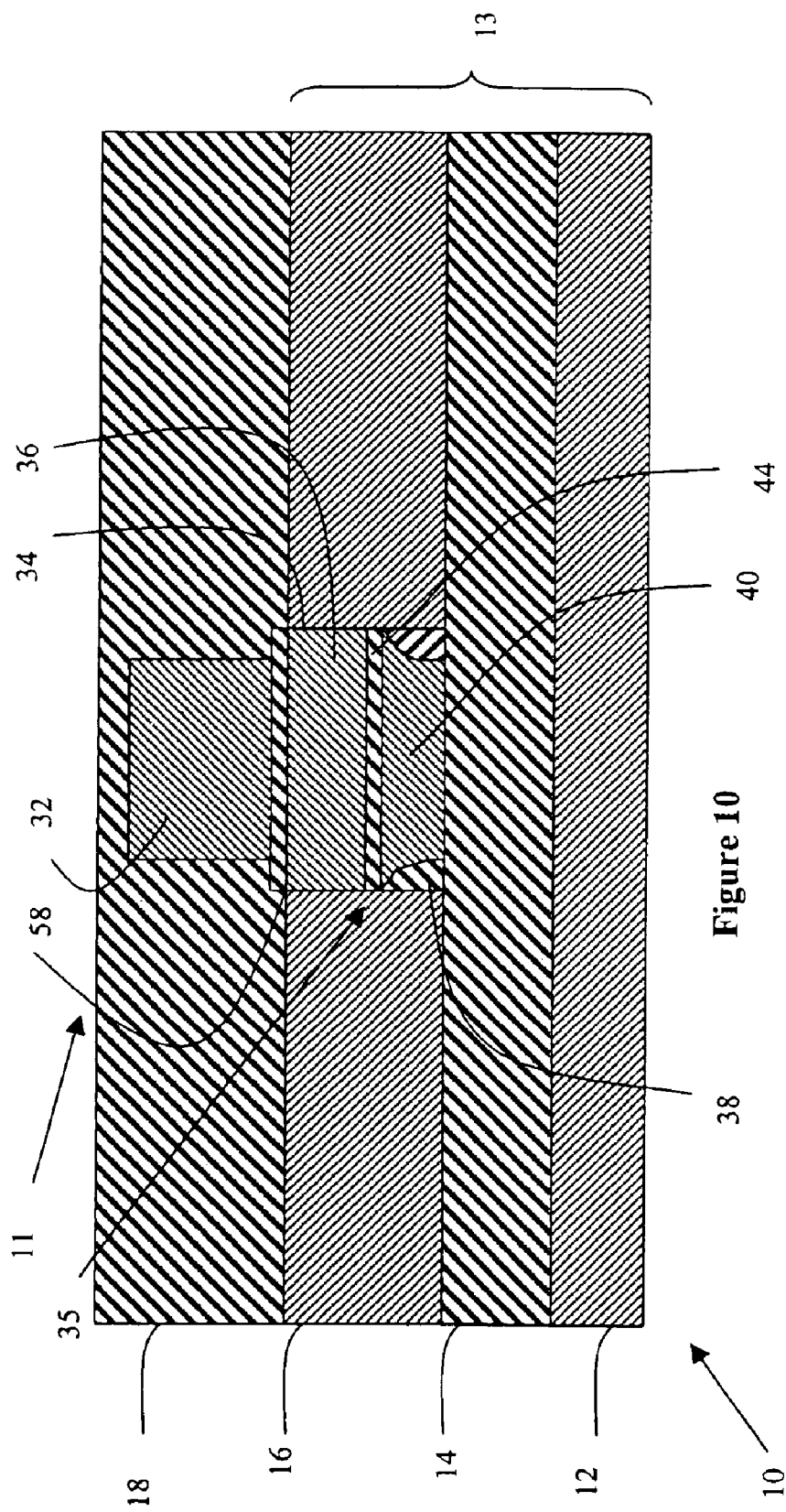
FIG. 10 is a cross-sectional view of another portion of an integrated circuit in accordance with another exemplary embodiment, the portion including a transistor having a top gate dielectric above the substrate of the integrated circuit.

With reference to FIG. 10, according to another exemplary embodiment, transistor 11 includes a top dielectric layer 58 that is provided above trench structure 35 (e.g., above the top surface of layer 16). In such an embodiment, layer 58 may extend over source and drain regions 22 and 24 or may be provided over channel region 36.

Figure 11:
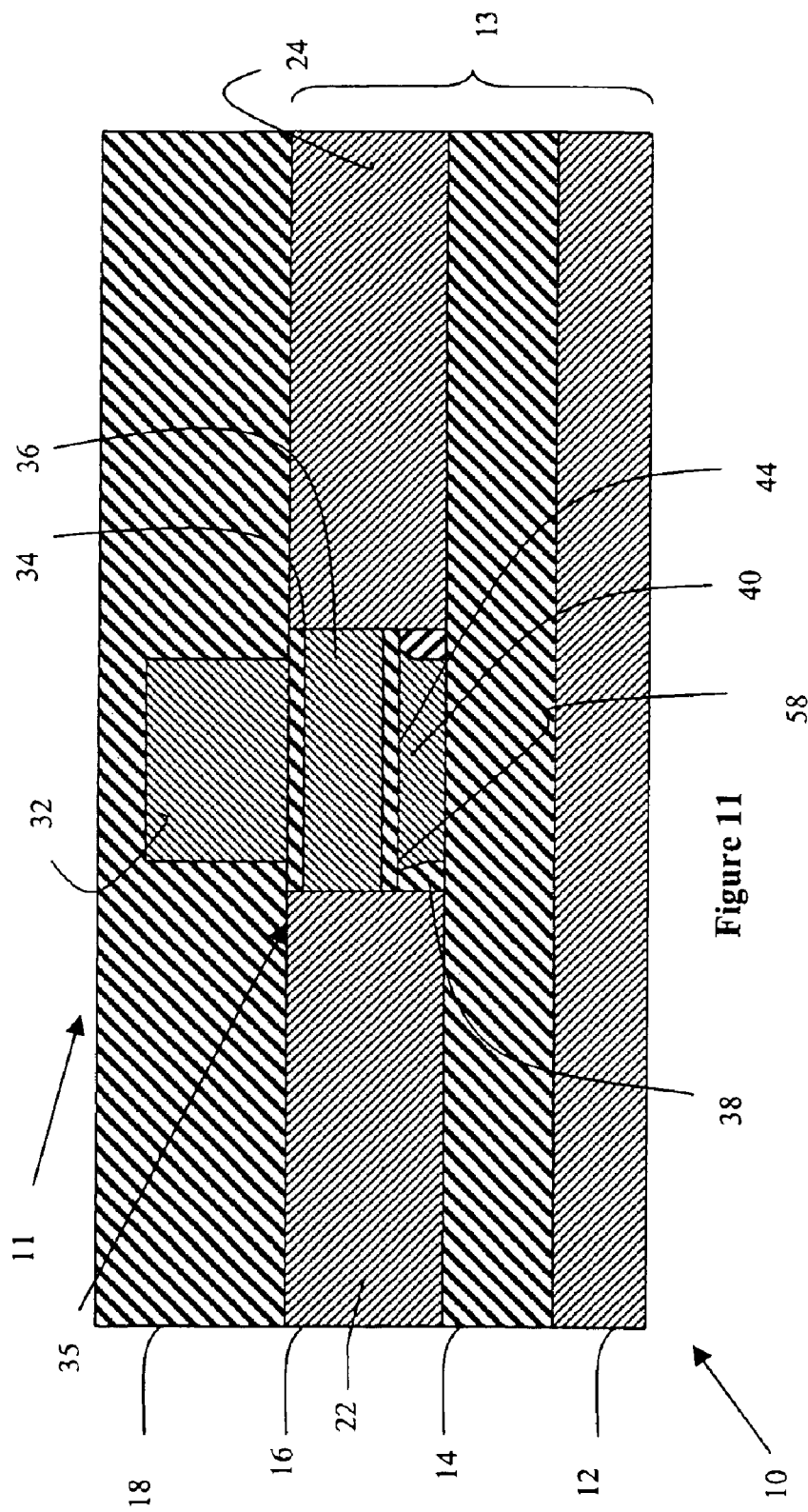
FIG. 11 is a cross-sectional view of a portion of an integrated circuit in accordance with another exemplary embodiment, the portion including a transistor having recessed spacers.

With reference to FIG. 11, according to another exemplary embodiment, transistor 11 includes recessed spacers 38. Spacers 38 can be recessed by anisotropically etching after formation of spacers 38. Recessing spacers 38 ensures greater isolation between gate conductor 40 and source and drain regions 22 and 24.

It should be understood that while the detailed drawings, specific examples, material types, thicknesses, dimensions, and particular values given provide a preferred exemplary embodiment of the present invention, the preferred exemplary embodiment is for the purpose of illustration only. The method and apparatus of the invention is not limited to the precise details and conditions disclosed. For example, although specific types of capping layers and semiconductor/germanium layers are shown, other structures can be utilized. Various changes may be made to the details disclosed without departing from the scope of the invention which is defined by the following claims.

What is claimed is:

1. A method of manufacturing an integrated circuit on a substrate including a compound semiconductor layer, the method comprising:

providing a trench in the compound semiconductor layer;

providing a bottom gate in the trench; and forming a strained semiconductor above the bottom gate and in the trench.

2. The method of claim 1, further comprising:

providing a bottom dielectric layer intermediate the bottom gate and the strained semiconductor.

3. The method of claim 2, further comprising:

providing a top dielectric layer above the strained semiconductor.

4. The method of claim 1, wherein the strained semiconductor is silicon.

5. The method of claim 1, wherein the strained semiconductor is laterally grown from the walls of the trench.

6. The method of claim 5, wherein the strained semiconductor layer is a silicon-germanium layer.

7. The method of claim 1, further comprising:

providing recessed spacers in the trench before providing the bottom gate.

8. The method of claim 7, further comprising removing a top portion of the recessed spacers.

9. The method of claim 1, wherein the bottom gate conductor is deposited by CVD.

10. The method of claim 1, wherein the bottom gate conductor comprises polysilicon.

11. A transistor comprising:

a first gate conductor disposed in a trench of a compound semiconductor layer;

a strained semiconductor layer disposed in the trench and above the first gate conductor; and a second gate conductor disposed above the strained semiconductor layer and above the trench.

12. The transistor of claim 11, further comprising:

a dielectric layer disposed between the first gate conductor and the strained semiconductor layer.

13. The transistor of claim 11, wherein the trench includes recessed spacers.

14. The transistor of claim 11, wherein the compound semiconductor layer is disposed above a buried oxide layer.

15. The transistor of claim 11, wherein the first gate conductor and the second gate conductor are each adjacent a dielectric layer.

16. The transistor of claim 15, wherein the compound semiconductor layer comprises silicon-germanium.

17. The transistor of claim 15, further comprising:

a pair of dielectric spacers adjacent the first gate conductor and within the trench.

18. A process of forming a transistor having a strained silicon channel region, the process comprising:

forming a trench in a compound semiconductor material;

forming a first gate at a bottom portion of the trench;

growing strained silicon above the first gate for the strained silicon channel region; and forming a second gate above the strained silicon.

19. The process of claim 18, further comprising:

providing spacers in the trench.

20. The process of claim 19, wherein the growing step is a lateral growing step.

* * * * *